US006606328B1

(12) United States Patent  
Susnow

(10) Patent No.: US 6,606,328 B1  
(45) Date of Patent: Aug. 12, 2003

(54) LOOK AHEAD ENCODER/DECODER ARCHITECTURE

(75) Inventor: Dean Susnow, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/461,394

(22) Filed: Dec. 15, 1999

(51) Int. Cl.[7] .............................................. H04M 7/00
(52) U.S. Cl. ....................................... 370/465; 341/58
(58) Field of Search ........................... 341/50, 58, 51, 341/55; 370/532, 537, 477, 465, 466

(56) References Cited

U.S. PATENT DOCUMENTS

| 4,486,739 A |   | 12/1984 | Franaszek et al. |
|---|---|---|---|
| 6,111,528 A | * | 8/2000 | Bagley ........................ 341/58 |
| 6,438,728 B1 | * | 8/2002 | Susnow ....................... 714/807 |

OTHER PUBLICATIONS

A. Widmer et al., "A DC–Balanced, Partitioned–Block, 8B/10B Transmission Code", *IBM J. Res. Develop.*, Vo. 27, No. 5, Sep. 1983, pp. 441–451.

* cited by examiner

*Primary Examiner*—Ken Vanderpuye
(74) *Attorney, Agent, or Firm*—Antonelli, Terry, Stout & Kraus, LLP

(57) ABSTRACT

Look ahead encoder and decoder architecture. To increase the encoding speed, bytes of input data to be encoded are applied in parallel to each encoder of a pair of encoders in the look ahead encoder architecture. One encoder of each pair receives a first control input signal, while the other receives a second control input signal. The output bytes of binary data from the two encoders are applied to a multiplexer which selects the proper output byte based on the control output signal resulting from the immediately preceding encoded output byte of binary data. In one embodiment, a single encoder encodes the previous byte, doubling the encoding speed. In a second embodiment, a number of encoder pairs are utilized, with the multiplexers connected in a ring to utilize the selected control output signal from one multiplexer as the select signal for the next multiplexer in the ring, increasing the encoder speed by a factor equal to the number of encoder pairs. The look ahead decoder archtecture is correspondingly structured. Data communication systems incorporating such encoder and decoder architecture are provided. The encoders might be 8-bit/10-bit encoders, with the decoders then being 8-bit/10-bit decoders.

23 Claims, 6 Drawing Sheets

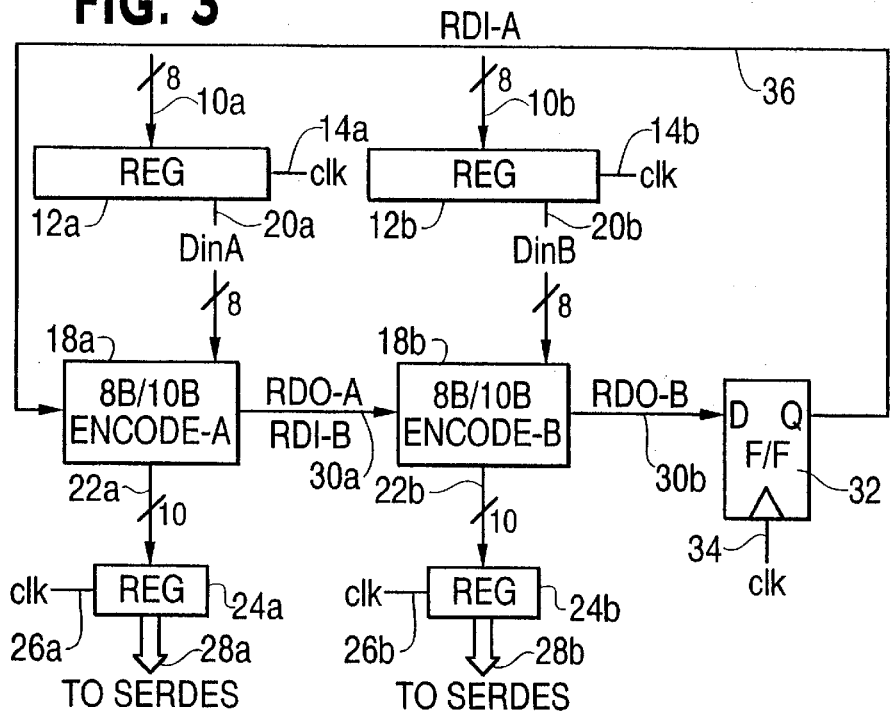
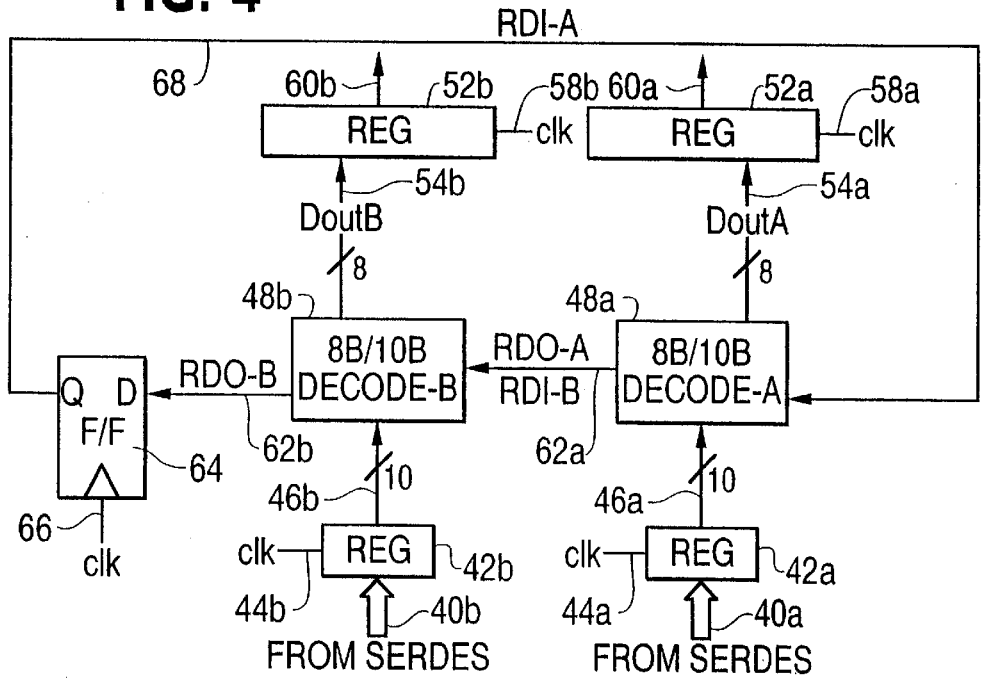

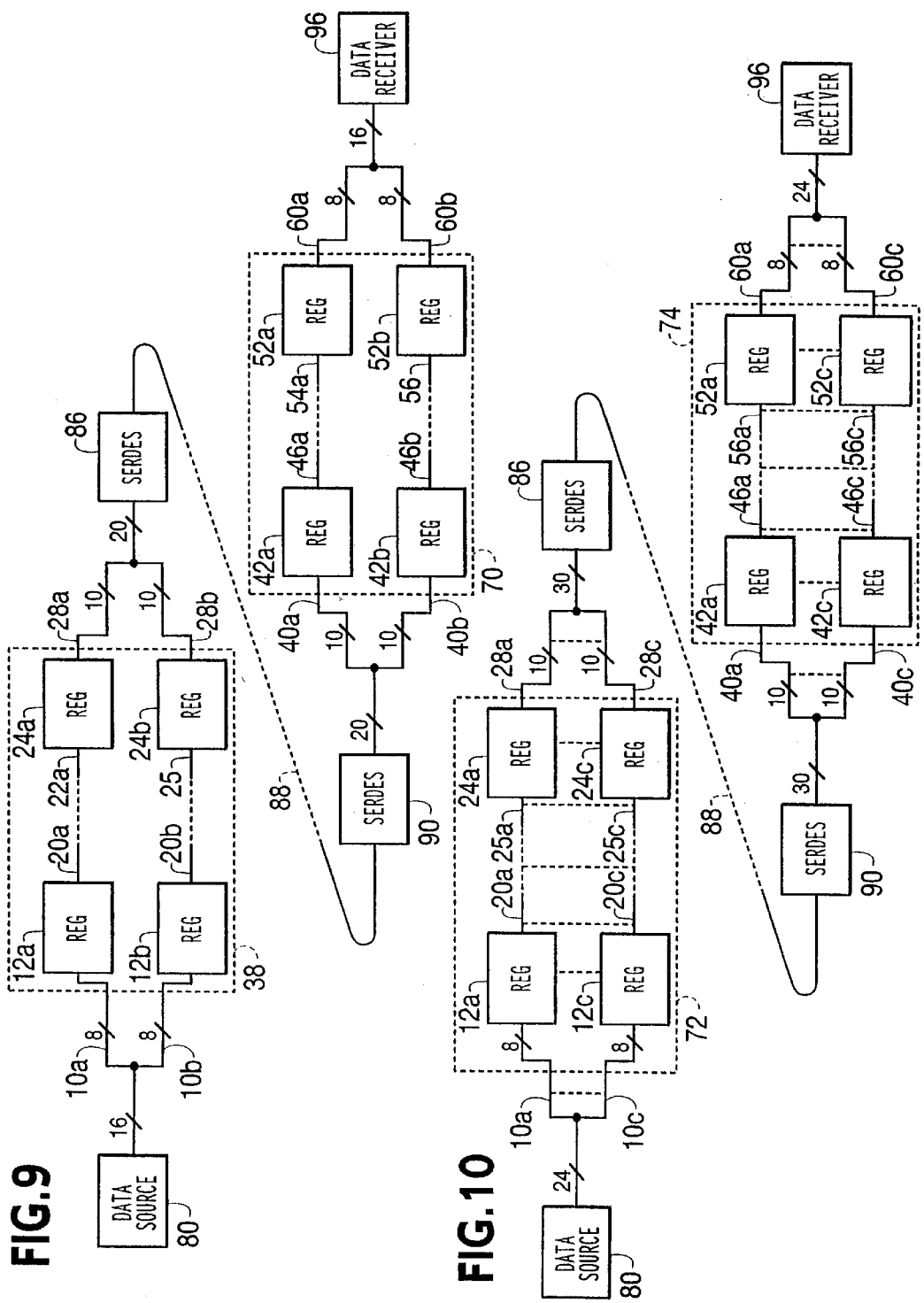

LOOK AHEAD ENCODER/DECODER ARCHITECTURE

FIELD

The present invention pertains to encoders and decoders. More particularly, the present invention pertains to cascaded, look-ahead encoder/decoder architecture, and especially 8-bit/10bit encoder/decoder architecture.

BACKGROUND

Communication networks often utilize 8-bit/10-bit ("8B/10B") encoders and decoders to improve reliability. An 8B/10B encoder encodes received eight bit bytes of binary data into ten bit bytes plus a disparity bit which indicates whether there is a difference between the number of ones and the number of zeros in the ten bit byte. The ten bit byte includes eight data bits and two check bits. Conversely, an 8B/10B decoder converts ten bit bytes of binary data into eight bit bytes plus a disparity bit. 8B/10B encoders and decoders are described, for example, in U.S. Pat. No. 4,486,739 and in the article "A DC-Balanced, Partitioned-Block, 8B/10B Transmission Code," by A. X. Widmer and T. A. Franaszek, *IBM Journal of Research and Development*, Volume 25, No. 5(September 1983), pages 440–451.

Improved communication capabilities have resulted in increased speed at which data can be transmitted. Basic 8B/10B encoders and decoders are limited in speed of operation and so present a potential limitation to data transmissions speed. While it might appear that speed of operation can be improved by cascading two 8B/10B encoders or two 8B/10B decoders, cascading, in fact, can not improve the speed because before the second encoder or decoder can commence processing, the disparity of the character encoded or decoded by the first encoder or decoder must be determined.

SUMMARY

The present invention is an 8B/10B encoder network including a number of pairs of 8B/10B encoders. One encoder of each encoder pair receives a positive disparity input signal, while the other encoder of each pair receives a negative disparity input signal. A data source provides successive eight bit input bytes of binary data cyclically to each encoder pair for simultaneous encoding by each encoder of the pair. A multiplexer is provided for each encoder pair to multiplex the ten bit output bytes and disparity signals provided by the two encoders of the pair in accordance with a control signal applied to the multiplexer. Each multiplexer applies its disparity output signal as the control signal of another of the multiplexers so that the multiplexers are connected in a ring. Application of the disparity output signal from one of the multiplexers to the control input of the next multiplexer in the ring is delayed to provide proper timing.

In a further aspect, the present invention is a similarly constructed 8B/10B decoder network.

BRIEF DESCRIPTION OF THE DRAWING(S)

These and other aspects and advantages of the present invention are more apparent from the following detailed description and claims, particular when considered in conjunction with the accompanying drawings in which like parts bear like reference numerals. In the drawings:

FIG. 3 is a block diagram of a network of cascaded 8B/10B encoders;

FIG. 4 is a block diagram of a network of cascaded 8B/10B decoders;

FIG. 9 is a block diagram of a first embodiment of a communication system including an 8B/10B encoder network and an 8B/10B decoder network in accordance with the present invention; and FIG. 10 is a block diagram of a second embodiment of a communication system including an 8B/10B encoder network and an 8B/10B decoder network in accordance with the present invention.

DETAILED DESCRIPTION

A typical 8B/10B encoder receives eight bit bytes of binary input data and an input disparity bit, encodes the eight bit bytes to ten bit data in accordance with the input disparity bit, and calculates the disparity of the ten bit byte to provide an output disparity bit that determines how to encode the next eight bit input byte. The output disparity bit indicates whether the ten bit byte has more ones than zeros (RD+), more zeros than ones (RD−), or an equal number of ones and zeros (disparity neutral). Similarly, a typical 8B/10B decoder receives ten bit bytes of data and an input disparity bit, decodes the ten bit bytes to eight bit bytes in accordance with the input disparity bit, and calculates the disparity of the ten bit input byte to provide an output disparity bit that determines how to decode the next ten bit input byte. 8B/10B encoders and decoders are standard protocol on many serial communication networks.

Figure 1:
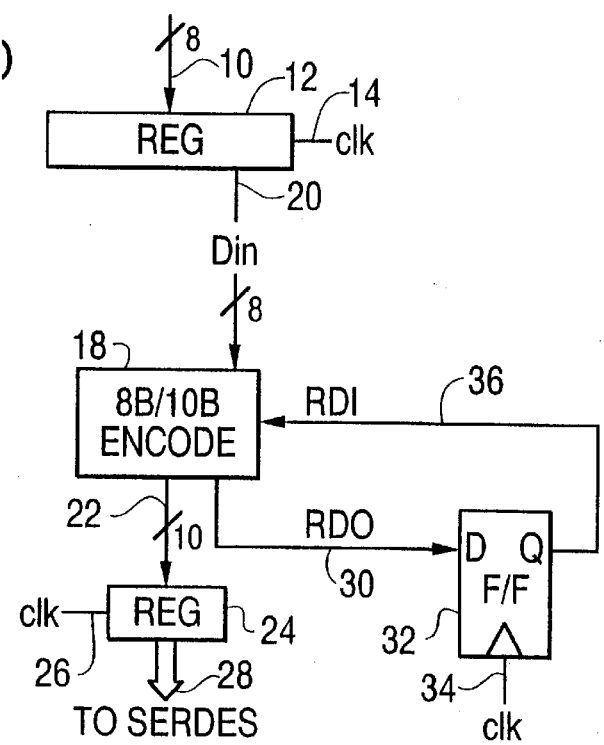
FIG. 1 is a block diagram of a prior art 8B/10B encoder circuit.

FIG. 1 depicts a typical 8B/10B encoder circuit. Eight bit data to be encoded is applied by input line 10 to input register 12, which also receives a clock signal on line 14. The eight bit bytes of data are applied on line 20 from register 12 to encoder 18 which encodes the data bytes to provide ten bit bytes based on a running disparity input (RDI) signal on line 36. The ten bit encoded bytes from encoder 18 are applied on line 22 to output register 24 which also receives the clock signal on line 26. The ten bit bytes in register 24 are applied on output line 28 for OF subsequent transmission, for example by way of a serializer/deserializer (SERDES).

Encoder 18 calculates the disparity of the encoded 10 bit output byte and applies a running disparity output (RDO) signal on line 30 to the D input of flip-flop 32 which also receives the clock input signal on line 34. The Q output of flip-flop 32 provides the RDI signal on line 36 to encoder 18 for use in encoding the next eight bit input byte. Each clock cycle, 8B/10B encoder 18 encodes an eight bit input byte based on the current RDI signal to provide a ten bit output byte and to update the RDO signal. If the encoded ten bit byte is disparity neutral, then the RDO signal does not change, but remains the same as for the previous encoded byte.

Figure 2:
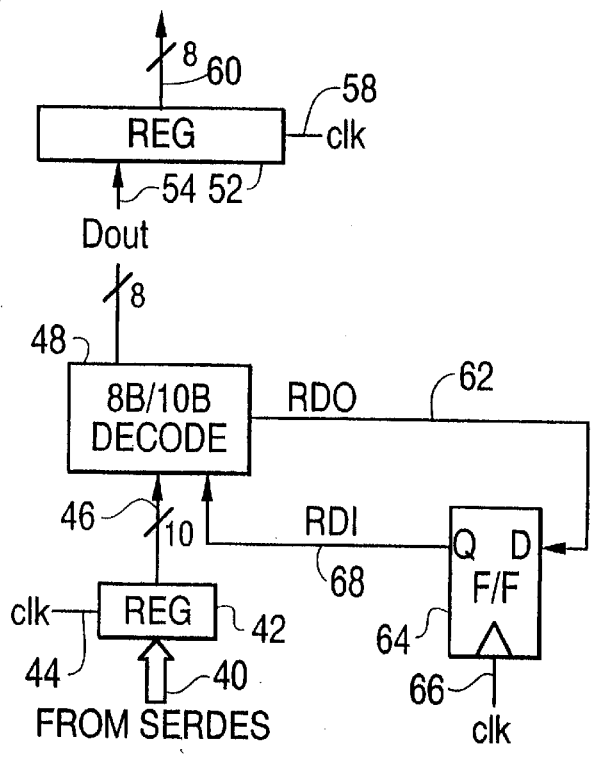
FIG. 2 is a block diagram of a prior art 8B/10B decoder circuit.

FIG. 2 depicts a typical 8B/10B decoder circuit. Ten bit bytes of data to be decoded are applied on line 40 from a source such as a SERDES to input register 42, which also receives a clock signal on line 44. The ten bit data is applied from register 42 on line 46 to 8B/10B decoder 48. The decoded eight bit bytes of output data from decoder 48 are applied on line 54 to output register 52, which also receives the clock signal on line 58. Register 52 provides the eight bit output bytes on line 60 for subsequent use.

8B/10B decoder 48 determines the disparity of each ten bit input byte and applies a RDO signal on line 62 to the D input of flip-flop 64, which also receives the clock input on line 66. The Q output of flip-flop 64 is applied on line 68 as the RDI signal to 8B/10B decoder 48 for use when decoding the next ten bit input byte.

The 8B/10B decoder works in a manner similar to that of 8B/10B encoder of FIG. 1. Each clock cycle, 8B/10B decoder 48 decodes the ten bit input byte based on the current RDI signal to provide an eight bit decoded byte and to update the RDO signal. If the ten bit input byte is disparity neutral, then the RDO signal does not change, but remains the same as for the previous input byte.

Typically, the encoding and decoding functions require in the order of 2.5–3.0 ns. While that speed is adequate for serial communication networks operating at, for example. 2.5 Gb/sec., greater communication speeds, as much as 10 Gb/sec. or higher, appear possible with present day technology. Even higher speeds may be possible in the future. In order to support presently possible communication speeds of 10 Gb/sec, an 8B/10B encoder or decoder must be able to sustain frequencies on the order of one GHz. Presently available 8B/10B encoders and decoders are not capable of this and would require a reduction in circuit latency to about one-third the present level.

One approach that was considered for increasing the operation speed is to cascade 8B/10B encoders or decoders so as, in effect, to increase the bandwidth of the circuit through parallelism. FIG. 3 depicts a pair of cascaded 8B/10B encoders, while FIG. 4 depicts a pair of cascaded 8B/10B decoders. The components and many of the interconnections are the same as in FIGS. 1 and 2, respectively, and so their description is not repeated in detail. In the cascaded encoder network of FIG. 3, successive eight bit bytes of data are applied alternately on lines 10a and 10b through registers 12a and 12b to encoders 18a and 18b. The RDO-A signal from encoder 18a is applied on line 30a as the RDI-B signal to encoder 18b, while the RDO-B signal from encoder 18b is applied on line 30b to the D input of flip-flop 32, which also receives the clock signal on line 34. The Q output of flip-flop 32 is applied on line 36 as the RDI-A signal to encoder 18a. Encoder 18b thus encodes its input byte in accordance with the RDO-A signal from encoder 18a. The RDO-B signal from encoder 18b is delayed one clock pulse by flip-flop 32 and utilized as the RDI-A signal to encoder 18a for encoding the next eight bit byte.

Similarly, in the cascaded decoders of FIG. 4, successive ten bit bytes of data are applied alternately on lines 40a and 40b through registers 42a and 42b to decoders 48a and 48b. The RDO-A signal from decoder 48a is applied on line 62a as the RDI-B signal to decoder 48b, while the RDO-B signal from decoder 48b is applied on line 62b to the D input of flip-flop 64 which also receives the clock signal on line 66. The Q output of flip-flop 64 provides the RDI-A signal on line 68 to decoder 48a. Decoder 48b decodes its input byte in accordance with the RDO-A signal from decoder 48a. The RDO-B signal from decoder 48b is delayed one clock pulse by flip-flop 64 and utilized as the RDI-A signal to decoder 48a for decoding of the next ten bit byte.

The encoder network of FIG. 3 suffers from the drawback that each encoder 18a, 18b must await the RDO signal from the other encoder 18b, 18a before encoding its input byte. That is, before one encoder can begin processing a newly-received input byte, the RDO signal from the other encoder must be available. Once encoder 18a commences processing an input byte, the determination of the RDO-A signal takes in the order of 2.5–3.0 ns. Encoder 18b requires this signal to begin its processing. Therefore, the output from encoder 18b is not valid until in the order of 5.0 and 6.0 ns after the rising edge of the system clock signal that initiated encoding by encoder 18a. Encoder 18a can not begin processing its next input byte until the RDO-B signal is available. Consequently, the cascaded encoders of FIG. 3 do not provide any increased encoding speed over the encoder circuit of FIG. 1. The critical timing path is from receipt of the data-in signal and the RDI-A signal at encoder 18a, through the encoding in encoder 18a and application of the RDO-A signal from encoder 18a on line 30a to encoder 18b, the encoding in encoder 18b, to application of the RDO-B signal on line 30b to the D input of flip-flop 32.

The decoder network of FIG. 4 suffers from the same drawback. The critical timing path in the cascaded decoder network is from receipt of the data-in signal and the RDI-A signal at decoder 48a, through the decoding in decoder 48a and application of the RDO-A signal on line 62a to decoder 48b, the decoding in decoder 48b, to application of the RDO-B signal on line 62b to the D input of flip-flop 64. Again, the output from decoder 48b is not valid until in the order of 5.0 to 6.0 ns after the rising edge of the system clock signal that initiated decoding by decoder 48a. The inherent property of running disparity thus make it ineffective to cascade the 8B/10B encoders and decoders as depicted in FIGS. 3 and 4 in order to achieve increased bandwidth.

Figure 5:
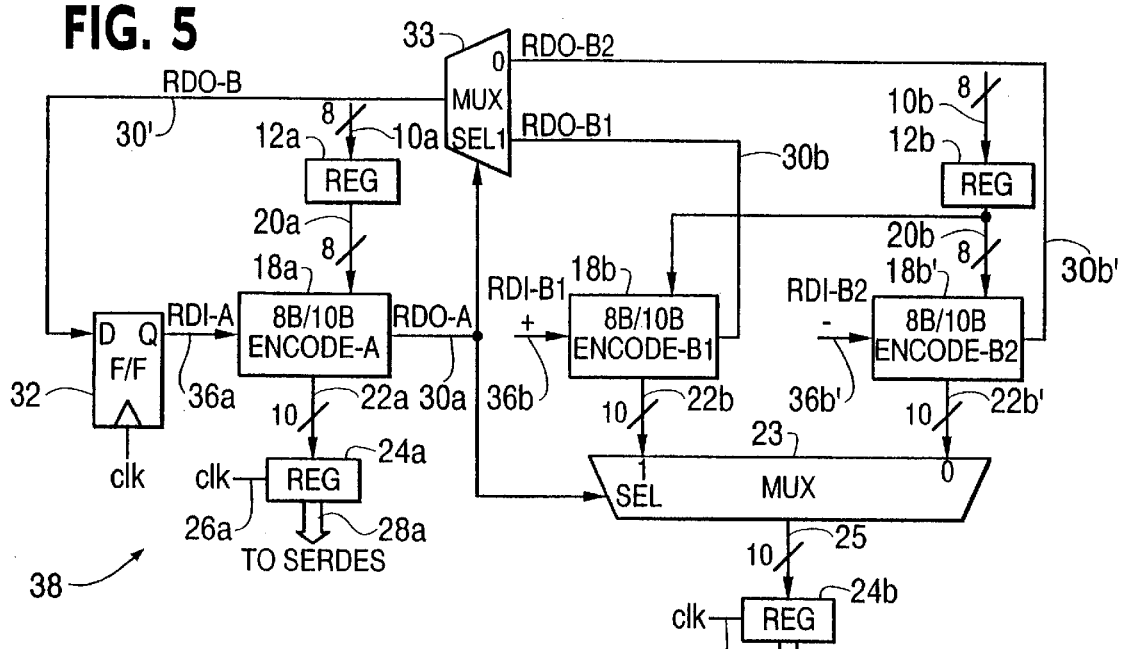
FIG. 5 is a block diagram of a first embodiment of look ahead 8B/10B encoder architecture in accordance with the present invention.

FIG. 5 depicts a first embodiment of look ahead 8B/10B encoder architecture 38 in accordance with the present invention. Again, description of those components and interconnections that are the same as those in FIG. 1 is not repeated in detail. Successive eight bit bytes of data are applied alternately on line 10a through register 12a to encoder 18a and on line 10b through register 12b and in parallel to encoders 18b and 18b'. Encoder 18b receives a positive disparity signal as its RDI-B1 signal on line 36b, while encoder 18b' receives a negative disparity signal as its RDI-B2 signal on line 36b'. Each encoder 18b, 18b' thus encodes the eight bit bytes applied through register 12b in accordance with its respective, pre-assigned RDI signal. The ten bit output byte from encoder 18b is applied on line 22b to the 1 input of multiplexer 23, and the ten bit output byte from encoder 18b' is applied on line 22b' to the 0 input of multiplexer 23. The output of multiplexer 23 is applied on line 25 to register 24b. The RDO-B1 output from encoder 18b is applied on line 30b to the 1 input of multiplexer 33, while the RDO-B2 signal from encoder 18b' is applied on line 30b' to the 0 input of multiplexer 33. The output of multiplexer 33 is applied on line 30' to the D input of flip-flop 32, the Q output of which provides the RDI-A signal on line 36a to encoder 18a. The RDO-A output from encoder 18a is applied on line 30a to the select input of multiplexer 23 and to the select input of multiplexer 33.

Successive eight bit bytes of input data are applied alternately on input lines 10a and 10b through register 12a and 12*b* to encoder 18*a* and in parallel to encoders 18*b* and 18*b'*. The transmission speed is such that encoders 18*b* and 18*b'* receive an eight bit byte for encoding before encoder 18*a* has completed encoding the input byte applied to it, and therefore before encoder 18*a* provides the RDO-A signal on line 30*a*. Encoders 18*b* and 18*b'* nevertheless commence encoding this input byte applied to them as soon as it is received, with encoder 18*b* utilizing a positive disparity signal as its RDI-B1 signal, and encoder 18*b'* utilizing a negative disparity signal as its RDI-B2 signal. When encoders 18*b* and 18*b'* have finished encoding, they apply their outputs to multiplexer 23. By that time, encoder 18*a* has encoded the input byte applied to it, and the RDO-A output is available to select the appropriate one of the inputs to multiplexer 23 to be the ten bit encoded output byte. Thus, if the RDO-A signal on line 30*a* indicates a positive disparity, then multiplexer 23 outputs the ten bit byte from encoder 18*b*, while if the RDO-A signal on line 30*a* indicates a negative disparity from encoder 18*a*, then multiplexer 23 outputs the ten bit byte from encoder 18*b'*. Likewise, if the RDO-A output from encoder 18*a* indicates a positive disparity, then multiplexer 33 provides the RDO-B1 signal from encoder 18*b* to the D input of flip-flop 32, for use as the RDI-A input during encoding of the next eight bit byte applied to encoder 18*a*, while if the RDO-A signal from encoder 18*a* indicates a negative disparity, then multiplexer 33 provides the RDO-B2 signal from encoder 18*b'* to the input of flip-flop 32. The RDI signal used for the encoding of each successive eight bit byte is thus the RDO signal of the immediately preceding encoded ten bit byte. Multiplexers 23 and 33 could, of course, be a single multiplexer.

Figure 6:
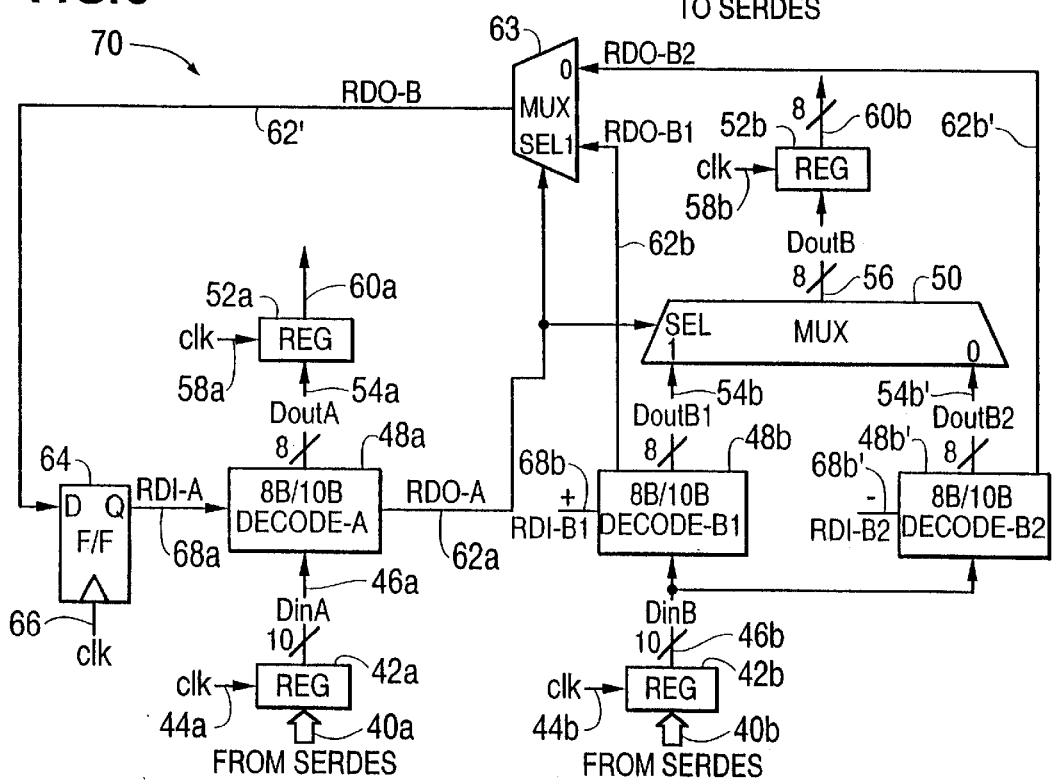
FIG. 6 is a block diagram of a first embodiment of look ahead 8B/10B decoder architecture in accordance with the present invention.

FIG. 6 depicts a corresponding embodiment of look ahead 8B/10B decoder architecture 70 in accordance with the present invention. Description of those components and interconnections that are the same as those as FIG. 2 are not repeated in detail. Successive ten bit bytes of data are applied alternately on line 40*a* through register 42*a* to decoder 48*a* and on line 40*b* through register 42*b* and in parallel to decoders 48*b* and 48*b'*. Decoder 48*b* receives a positive disparity signal as its RDI-B1 signal on line 68*b*, while decoder 48*b'* receives a negative disparity signal as its RDI-B2 signal on line 68*b'*. Each decoder 48*b*, 48*b'* then decodes the ten bit byte applied through register 42*b* in accordance with its respective, preassigned RDI signal. The eight bit output byte from decoder 48*b* is applied on line 54*b* to the 1 input of multiplexer 50, and the eight bit output byte from decoder 48*b'* is applied on line 54*b'* to the 0 input of multiplexer 50. The output of multiplexer 50 is applied on line 56 to register 52*b*. The RDO-B1 output from decoder 48*b* is applied on line 62*b* to the 1 input of multiplexer 63, while the RDO-B2 output from decoder 48*b'* is applied on line 62*b'* to the 0 input of multiplexer 63. The output of multiplexer 63 is applied on line 62' to the D input of flip-flop 64, the Q output of which provides the RDI-A signal on line 68*a* to decoder 48*a*. The RDO-A output from decoder 48*a* is applied on line 62*a* to the select input of multiplexer 50 and to the select input of multiplexer 63.

Successive ten bit bytes of input data are applied alternately on lines 40*a* and 40*b* through registers 42*a* and 42*b* to decoder 48*a* and in parallel to decoders 48*b* and 48*b'*. The transmission speed is such that decoders 48*b* and 48*b'* receive a ten bit byte for decoding before decoder 48*a* has completed decoding the input byte applied to it, and therefore before decoder 48*a* provides the RDO-A signal on line 62*a*. Decoders 48*b* and 48*b'* nevertheless commence decoding the input byte applied to them as soon as it is received, with decoder 48*b* utilizing a positive disparity signal as its RDI-B1 signal, and decoder 48*b'* using a negative disparity signal as its RDI-B2. When decoders 48*b* and 48*b'* have finished decoding, they apply their outputs to multiplexer 50. By that time, decoder 48*a* has decoded the input byte applied to it, and the RDO-A output is available to select the appropriate one of the inputs to multiplexer 50 to be the eight bit decoded output byte. Thus, if the RDO-A signal on line 62*a* indicates a positive disparity, then multiplexer 50 outputs the eight bit byte from decoder 48*b*, while if the RDO-A signal on line 62*a* indicates a negative disparity from decoder 48*a*, then multiplexer 50 outputs the ten bit byte from decoder 48*b'*. Likewise, if the RDO-A output from decoder 48*a* indicates a positive disparity, then multiplexer 63 provides the RDO-B1 signal from decoder 48*b* to the D input of flip-flop 64 for use as the RDI-A input during decoding of the next ten bit byte applied decoder 48*a*. If the RDO-A signal from decoder 48*a* indicates a negative disparity, then multiplexer 63 provides the RDO-B2 signal from decoder 48*b'* to the input of flip-flop 64. Thus, the RDI signal used for the decoding of each successive ten bit byte is the RDO signal of the immediately preceding eight bit decoded byte. Multiplexers 50 and 63 could, of course, be a single multiplexer.

Figure 7:
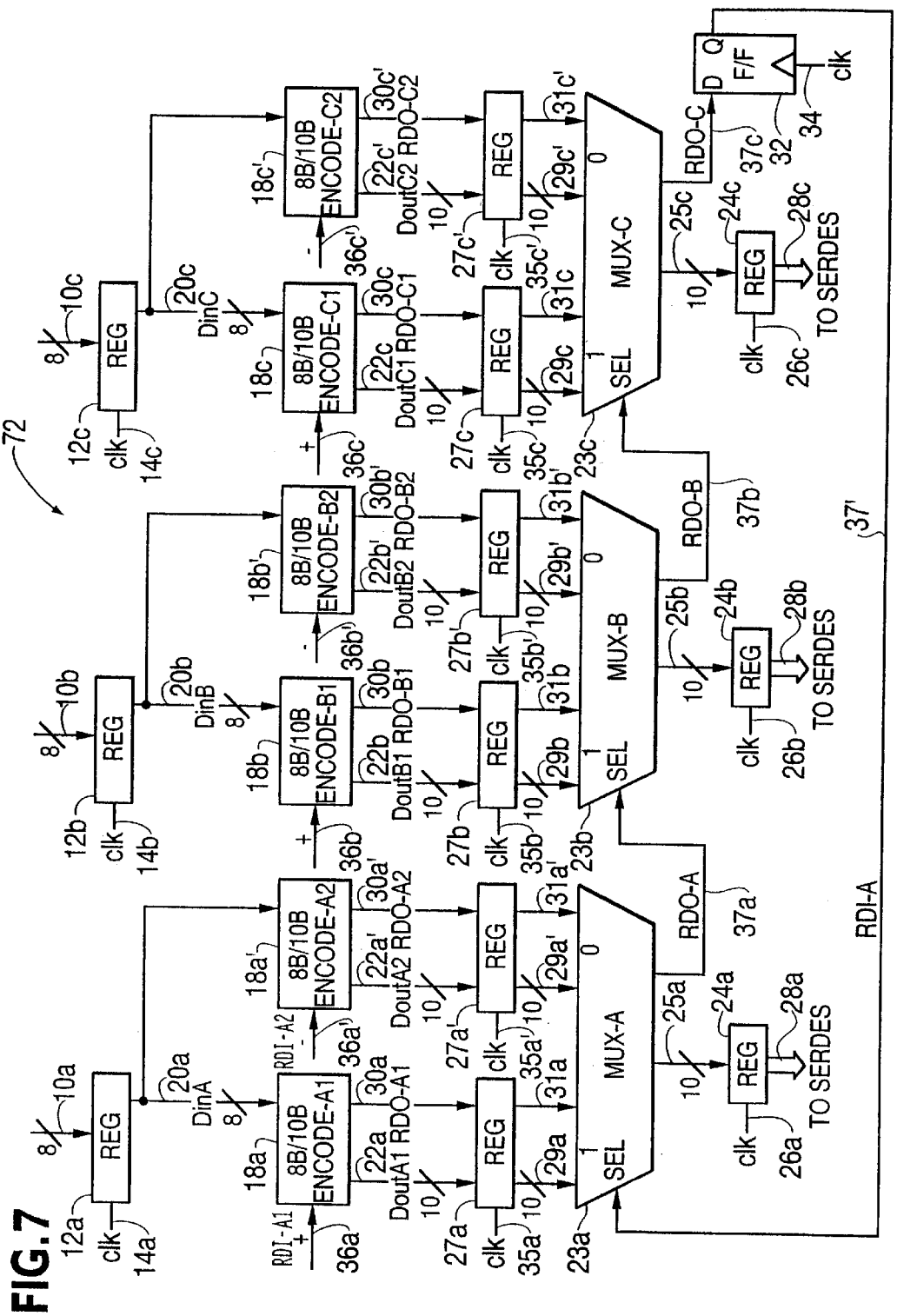
FIG. 7 is a block diagram of a second embodiment of look ahead 8B/10B encoder architecture in accordance with the present invention.

The architecture of FIGS. 5 and 6 encodes or decodes data in two byte groups. Before any of the encoders or decoders can commence processing of a new byte, it must have completed the preceding byte. This takes 2.5 to 3.0 ns, as described above. Consequently, the architecture of FIGS. 5 and 6 doubles the overall network encoding and decoding speeds, and so permits doubling of system transmission speed. The architecture of FIGS. 5 and 6 decreases the latency to about one-half that of the circuitry of FIGS. 1 and 2. As set forth above, it is desired to reduce the FIG. 1 and 2 circuit latency to about one third of that level. FIG. 7 depicts cascaded, look ahead 8B/10B encoder architecture 72 in accordance with the present invention which is capable of achieving this. FIG. 7 illustrates three sets of encoder pairs with related circuitry which thus increase the encoding speed, and corresponding permit increase in transmission speed, by a factor of about three. The three sets of encoder pairs and related circuitry are substantially identical, and so only one of them will be described in detail, and those aspects of the circuitry that are the same as in the basic 8B/10B encoder circuit of FIG. 1 will not be repeated in detail.

In the first set of circuitry, eight bit bytes of input data on line 10*a* pass through register 12*a* and are applied in parallel to encoders 18*a* and 18*a'*. Encoder 18*a* receives a positive RDI-AL signal on its input line 36*a*, while encoder 18*a'* receives a negative RDI-A2 signal on its input line 36*a'*. Each of the encoders 18*a*, 18*a'* then encodes the eight bit byte in accordance with its respective RDI input signal. Encoder 18*a* applies the resulting ten bit byte of encoded data on line 22*a* and the resulting RDO-A1 signal on line 30*a* to register 27*a*. In like manner, encoder 18*a'* encodes the eight bit byte in accordance with the negative RDI-A2 input on its line 36*a'* and applies the resulting ten bit byte on line 22*a'* and the resulting RDO-A2 signal on line 30*a'* to byte on line 29*a* and the RDO-A1 signal on line 31*a* to the input of an. associated multiplexer 23*a*. At that same clock pulse on line 35*a'* to register 27*a'*, register 27*a'* applies its ten bit byte on line 29*a'* and its RDO-A2 signal on line 31*a'* to the 0 input of multiplexer 23*a*. The ten bit encoded output byte from multiplexer 23*a* is applied on line 25*a* to register 24*a* which also receives the clock signal on line 26*a*. The output of register 24*a* is applied on line 28*a* to appropriate circuitry, such as a SERDES.

The other two sets of encoder pairs and circuitry are similarly connected. The RDO-A output from multiplexer 23a is applied on line 37a to the select input of multiplexer 23b. Likewise, the RDO-B output from multiplexer 23b is applied on line 37b to the select input of multiplexer 23c. The RDO-C output from multiplexer 23c is applied on line 37c to the D input of flip-flop 32 which also receives the clock input of line 34. The Q output from flip-flop 32 is applied as the RDI-A signal on line 37' to the select input of multiplexer 23a. Thus, the multiplexers 23a, 23b, 23c are connected in a ring.

Successive eight bit bytes of input data are applied cyclically on lines 10a, 10b, and 10c to registers 12a, 12b, and 12c in turn. At the next clock pulse, each register applies its eight bit byte in parallel to the two encoders connected to its output. Thus, by way of example, the eight bit byte in register 12a is applied to encoders 18a and 18a'. These encoders then begin encoding on the basis of their respective RDI signals. Encoders 18a and 18a' apply their outputs to registers 27a and 27a', respectively. At the next clock pulse, register 27a applies the ten bit encoded byte to the 1 input of the associated multiplexer 23a. while register 27a' applies its ten bit encoded output to the 0 input of multiplexer 23a. Based on the RDI-A signal on line 37', which is applied to the select input of multiplexer 23a, multiplexer 23a applies the appropriate data output on line 25a to register 24a and applies the appropriate RDO-A output on line 37a to the select input of multiplexer 23b. At the next clock pulse on line 26a, register 24a outputs the ten bit data byte on line 28a.

While the first eight bit byte of data is being encoded by encoders 18a and 18a', the next eight bit byte is being applied on input line 10b through register 12b to both encoder 18b and Is encoder 18b', and the subsequent eight bit byte is being applied on line 10c through register 12c Using their respective RDI-B1 and RDI-B2 inputs, encoders 18b and 18b' encode the eight bit byte applied to them and provide their outputs to registers 27b and 27b', respectively. Likewise, using their respective RDI-C1 and RDI-C2 inputs, encoders 18c and 18c' encode the eight bit byte applied to them and apply a resulting ten bit encoded byte to registers 27c and 27c', respectively. When registers 27a and 27a' apply outputs to the 1 and 0 inputs, respectively, of their associated multiplexer 23a, the multiplexer selects one of these sets of inputs as its output, based on the RDI-A signal applied to the select input of the multiplexer. The corresponding ten bit byte of encoded data is applied to register 24a, while the corresponding RDO-A signal is applied on line 37a to the select input of multiplexer 23b. When registers 27b and 27b' then provide outputs to the 1 input and the 0 input, respectively, of their associated multiplexer 23b, that multiplexer selects one of these sets of inputs based on the select signal it receives on line 37a. The corresponding ten bit byte is provided as an output on line 25b to register 24b, while the corresponding RDO-B signal is applied on line 37b to the select input of multiplexer 23c. In like manner, when registers 27c and 27c' apply outputs to the 1 input and the 0 input, respectively, of their associated multiplexer 23c, that multiplexer selects one of those sets of inputs as its output, based on the RDO-B signal on line 37b. The corresponding ten bit byte of encoded data is provided as an output on line 25c to register 24c. The corresponding RDO-C signal is applied on line 37c to the D input of flip-flop 32, and at the next clock pulse on line 34, the Q output of flip-flop 32 provides that signal as the RDI-A input to the select input of multiplexer 23a, for use in selecting the appropriate output of the next encoded byte from each of registers 27a and 27a'. Thus, again, the RDI signal used for the encoding of each successive eight bit byte is the RDO signal of the immediately preceding encoded ten bit byte.

While FIG. 7 depicts three sets of pairs of encoders with their respectively associated multiplexers connected as a ring, a greater number of sets of pairs of encoders can be implemented, depending upon the encoding speed desired. The cascaded, look ahead 8B/10B encoder architecture of FIG. 7 employs two encoding functions for each eight bit input byte. The outputs of the two encoding functions are determined by the two RDI signals. One encoder utilizes an RDI+ input, while the other encoder utilizes an RDI– input. This allows the eight bit input bytes to be processed in parallel as soon as received, rather than having to wait for the disparity output calculation of the previous input byte. An N-stage encoding system could encode N characters in 2.5–3.0 ns utilizing encoder circuitry having an encoding speed of 2.5 3.0 ns.

Since all of the encoder pairs in the circuitry of FIG. 7 perform encoding in parallel, they are not dependent upon the disparity of the previously encoded character, and the circuitry can be extended to N-stages without adding to the propagation delay. The encoding function is isolated from the disparity selection. The selection of the correct encoder of each pair to provide the ten bit data and the disparity output is based on the propagation of the N multiplexers in an N-stage encoder. In present day technology, the propagation of a two to one multiplexer is on the order of 250 ps, and so approximately twelve encoder pairs could be utilized before the multiplexer propagation time matches that of the encoding function. This, then provides a twelve times improvement over the standard 8B/10B encoder of FIG. 1. As technology improves the encoders and the multiplexers, this improvement in speed will increase.

Figure 8:
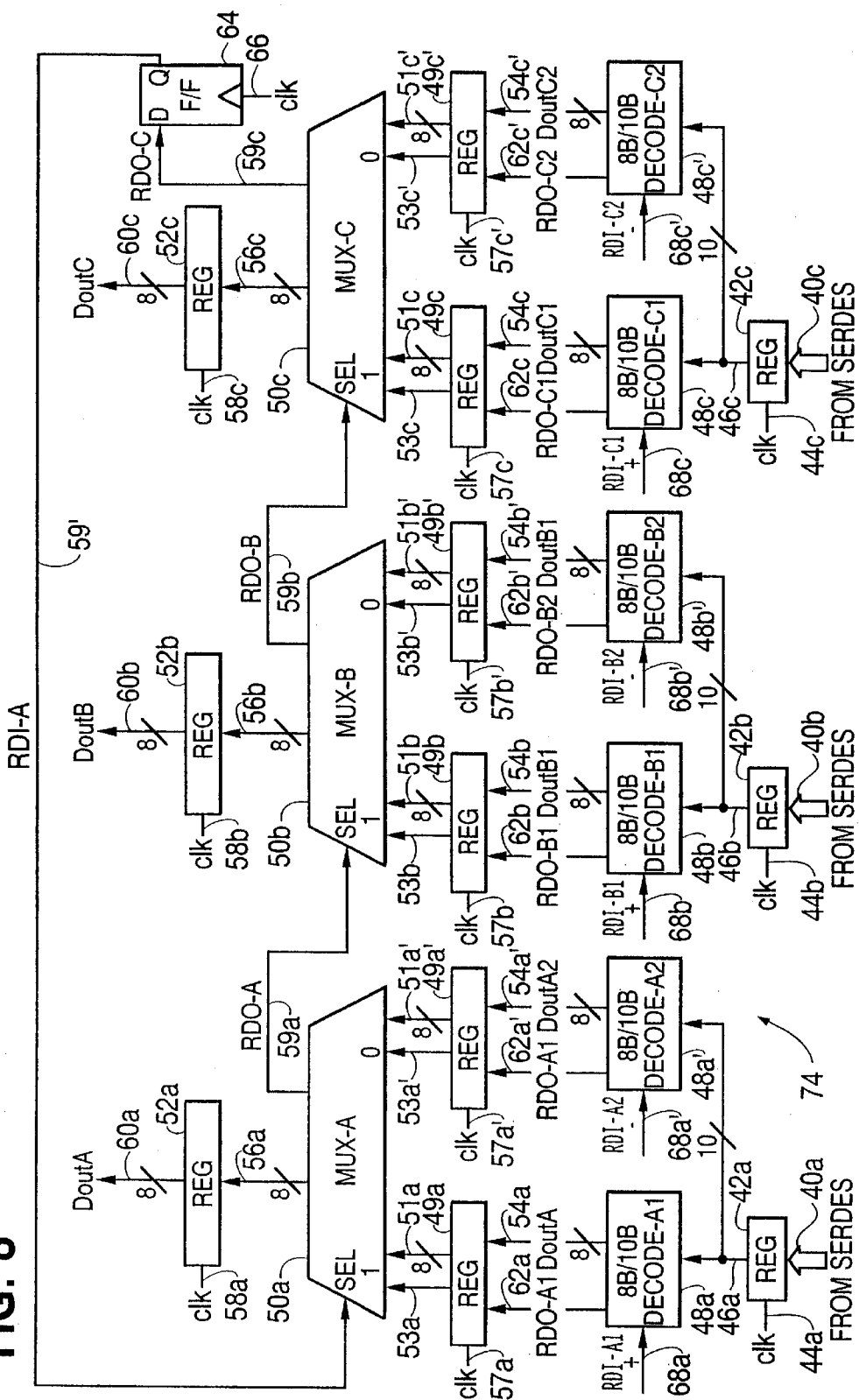
FIG. 8 is a block diagram of a second embodiment of look ahead 8B/10B decoder architecture in accordance with the present invention.

FIG. 8 depicts cascaded, look ahead 8B/10B decoder architecture 74 in accordance with the present invention, made up of three sets of decoder pairs, which cyclically receive the 10-bit input data bytes, and three associated multiplexers for selecting the decoder of each pair to provide the decoded output, based on the RDO signal of the previously decoded ten bit input byte, and those aspects of the circuitry that are the same as in the basic 8B/10B decoder circuit of FIG. 2 will not be repeated detail. The circuitry of the three stages is essentially the same, and so only that of the first stage is described. Within the first stage, ten bit input bytes to be decoded are applied on line 40a to register 42a which also receives the clock signal on line 44a. The ten bit bytes are then applied in parallel from register 42a to decoders 48a and 48a'. Decoder 48a receives a positive RDI-A1 signal on line 68a, while decoder 48a' receives a negative RDI-A2 signal on line 68a'. Decoder 48a provides the eight bit decoded byte on line 54a and the resulting RDO-A1 signal on line 62a to register 49a. Register 49a receives the clock signal on line 57a and applies the eight bit decoded byte on line 51a and the RDO-A1 signal on line 53a to the 1 input of an associated multiplexer 50a. Simultaneously, decoder 48a' decodes the ten bit input byte based on the RDI-A2 signal applied to it by line 68a' and applies the resulting eight bit decoded byte on line 54a' and the RDO-A2 signal on line 62a' to register 49a'. Register 49a' receives a clock signal on line 57a' and applies the eight bit byte on line 51a' and the RDO-A2 signal on line 53a' to the 0 input of the associated multiplexer 50a. Based on the signal applied to its select input, multiplexer 50a selects either the signals applied to its1 input or the signals applied to its0 input and provides the selected eight bit decoded byte on line 56a to register 52a and the corresponding RDO-A signal on line 59a to the select input of multiplexer 50b. Register 52a receives the clock signal on line 58a and provides the eight bit output byte on line 60a for further use.

The second and third decoder networks are of similar construction. Multiplexer 50b provides its RDO-B signal on line 59b to the select input of multiplexer 50c, while multiplexer 50c provides its RDO-C output on line 59c to the D input of flip-flop 64. Flip-flop 64 also receives the clock signal on line 66 and provides its Q output on line 59' as the RDI-A signal to the select input of multiplexer 50a. Thus, the multiplexers 50a, 50b, and 50c are connected in a ring.

Successive ten bit bytes of input data are applied cyclically on lines 40a, 40b, and 40c to registers 42a, 42b, and 42c in turn. At the next clock pulse, each register applies its ten bit byte in parallel to the two decoders connected to its output. Thus, by way of example, the ten bit byte in register 42a is applied to decoders 48a and 48a'. These decoders then begin decoding on the basis of their respective RDI signals. Decoders 48a and 48a' apply their output to registers 49a and 49a', respectively. At the next clock pulse, register 49a applies the eight bit decoded byte to the 1 input of the associated multiplexer 50a, while register 49a' applies its eight bit decoded output to the 0 input of multiplexer 50a. Based on the RDI-A signal on line 59', which is applied to the select input of multiplexer 50a, multiplexer 50a applies the appropriate eight bit output byte on line 56a to register 52a and applies the appropriate RDO-A output on line 59a to the select input of multiplexer 50b. At the next clock pulse on line 58a, register 52a outputs the eight bit data byte on line 60a.

While the first ten bit byte of data is being decoded by decoders 48a and 48a', the next ten bit byte is being applied on input line 40b through register 42b to both encoder 48b and encoder 48b', and the subsequent eight bit byte is being applied on line 40c through register 42c to encoders 48c and 48c'. These inputs occur at the clock rate applied on lines 44a, 44b, and 44c. Using their respective RDI-B1 and RDI-B2 inputs, decoders 48b and 48b' decode the ten bit byte applied to them and provide their outputs to registers 49b and 49b', respectively. Likewise, using their respective RDI-C1 and RDI-C2 inputs, decoders 48c and 48c' decode the ten bit byte applied to them and apply the resulting eight bit decoded byte to registers 49c and 49c', respectively. When registers 49a and 49a' apply outputs to the 1 and 0 inputs, respectively, of their associated multiplexer 50a, the multiplexer selects one of these sets of inputs as its output, based on the RDI-A signal applied to the select input of the multiplexer. The corresponding eight bit byte of decoded data is applied to register 52a, while the corresponding RDO-A signal is applied on line 59a to the select input of multiplexer 50b. When registers 49b and 49b' then provide outputs to the 1 input and the 0 input, respectively, of their associated multiplexer 5Gb, that multiplexer selects one of these sets of inputs based on the select signal it receives on line 59a. The corresponding eight bit byte is provided as an output on line 56b to register 52b, while the corresponding RDO-B signal is applied on line 59b to the select input of multiplexer 50c. In like manner, when registers 49c and 49c' then apply outputs to the 1 input and the 0 input, respectively, of their associated multiplexer 50c, that multiplexer selects one of those sets of inputs as its output, based on the RDO-B signal on line 59b. The corresponding eight bit byte of my decoded data is provided as an output on line 56c to register 52c. The corresponding RDO-C signal is applied on line 59c to the D input of flip-flop 64, and at the next clock pulse on line 66, the Q output of flip-flop 64 provides that signal as the RDI-A input to the select input of multiplexer 50a, for use in selecting the appropriate output of the next decoded byte from each of registers 49a and 49a'. Thus, again, the RDI signal used for the decoding of each successive ten bit byte is the RDO signal of the immediately preceding decoded ten bit byte.

While FIG. 8 depicts three sets of pairs of decoders with their respectively associated multiplexers connected as a ring, as with the encoder architecture of FIG. 7 a greater number of sets of pairs of decoders can be implemented, depending upon the decoding speed desired. An N-stage decoding system could decode N characters in 2.5–3.0 ns utilizing decoder circuitry having a decoding speed of 2.5–3.0 ns. In present day technology, the propagation of the two to one multiplexer is on the order of 250 ps., and so approximately twelve decoder pairs could be utilized before the multiplexer propagation time matches that of the decoding function. This, then provides a twelve times improvement over the standard 8B/10B decoder of FIG. 2. As technology improves the decoders and the multiplexers, this improvement in speed will increase.

The cascaded, look ahead 8B/10B encoders and decoders of the present invention permit higher speed communication. FIG. 9 illustrates a communication system including an 8B/10B encoder network and an 8B/10B decoder network in accordance with the present invention. FIG. 9 illustrates the communication system with reference to the encoder network 38 of FIG. 5 and the decoder network 70 of FIG. 6. Data source 80 applies eight bit bytes of data on line 10a to register 12a and on line 10b to register 12b within encoder network 38. Data source 80 might output 16 bit bytes at the clock rate of encoder network 38, with eight bits going to each register 12a and 12b. As a further alternative, data source 80 could provide eight bit bytes to a demultiplexer which applies the bytes alternately to register 12a and to register 12b. The eight bit bytes are encoded within encoder network 38 as described above with reference to FIG. 5. The resulting ten bit bytes of encoded data outputted from registers 24a and 24b are applied to SERDES 86 which applies the encoded data over communication line 88 to SERDES 90. Again, the outputs of registers 24a and 24b can be applied as a 20 bit byte to SERDES 86 or as two ten bit bytes with appropriate timing or as separate ten bit bytes through a multiplexer. SERDES 90 applies the encoded data on line 40a to register 42a and on line 40b to register 42b within decoder network 70. The ten bit bytes are then decoded as described above with reference to FIG. 6. The decoded eight bit bytes from register 52a and 52b are applied by lines 60a and 60b to data receiver 96. As with data source 80 and SERDES 86, SERDES 90 and data receiver 96 can operate on 20 bit bytes and 16 bit bytes, respectively, or with a demultiplexer and a multiplexer. The communication system of FIG. 9 thus is capable of transmission of data at an increased rate due to the speed with which encoder network 38 and decoder network 70 encode and decode the data.

FIG. 9 illustrates a communication system in accordance with the present invention using the encoder network of FIG. 5 and the decoder network of FIG. 6. FIG. 10 illustrates a similar communication system in accordance with the present invention using the encoder network of FIG. 7 and the decoder network of FIG. 8. Its circuitry and operation are evident from the above description of those figures, and so are not repeated here.

The above description has omitted details of 8B/10B encoders and decoders not necessary to an understanding of the present invention, such as data/control input signals, error output signals, system reset signals, and minor time delays to assure proper signal sequencing, all of which are well known to those skilled in the art. While the above description has been with reference to 8B/10B encoders and decoders and a running disparity signal, other types of encoders and decoders could be utilized, with an appropriate binary control signal. The term "byte" has been used in its broad sense of a string of a number of bits, and not merely with reference to a string of eight bits. Thus, although the present invention has been described with reference to preferred embodiment, various rearrangements, substitutions, and alternations could be made, and still the result would be within the scope of the invention.

What is claimed is:

1. An encoder network, comprising:
    a plurality of pairs of encoders, each encoder capable of encoding an input byte of binary data based on a control input signal to provide a corresponding output byte of binary data and a control output signal;
    a first control signal source providing a first control input signal to one encoder of each of said pairs of encoders;
    a second control signal source providing a second control input signal to the other encoder of each of said pairs of encoders;
    a data source providing successive input bytes of binary data cyclically to each encoder pair, for simultaneous encoding thereof by each encoder of such encoder pair;
    a like plurality of multiplexers, each multiplexer multiplexing the output bytes and control output signals provided by the two encoders of an associated one of said plurality of pairs of encoders in accordance with a select control signal applied to a select input of such multiplexer, each multiplexer applying its control output signal as the select control signal of another of said multiplexers to connect said plurality of multiplexers in a ring; and
    a delay circuit for delaying application of the control output signal of one of said multiplexers to the select input of the next multiplexer in the ring.

2. An encoder network as claimed in claim 1, wherein said delay circuit comprises a flip-flop.

3. An encoder network as claimed in claim 1, wherein each of said encoders is an 8bit/10-bit encoder.

4. An encoder network comprising:
    first, second and third encoders, each encoder capable of encoding an input byte of binary data based on a control input signal to provide a corresponding output byte of binary data and a control output signal;
    a first control signal source providing a first control input signal to said second encoder;
    a second control signal source providing a second control input signal to said third encoder;
    a data source providing successive bytes of binary data alternately to said first encoder, for encoding thereof by said first encoder, and in parallel to said second and third encoders, for simultaneous encoding thereof by said second and third encoders;
    an output connection;
    a selection circuit for selecting the binary data output bytes from one of said second and third encoders for application to said output-connection, based on the control output signal from said first encoder, and
    a control circuit responsive to the control output signal from said first encoder for selecting one of the control output signal from said second encoder and the control output signal from said third encoder to provide the control input signal to said first encoder for use in encoding a subsequent byte of binary data.

5. An encoder network as claimed in claim 4, wherein said selection circuit comprises a multiplexer.

6. An encoder network as claimed in claim 4, wherein said control circuit comprises a multiplexer and a delay circuit.

7. An encoder network as claimed in claim 6, wherein said delay circuit comprises a flip-flop.

8. An encoder network as claimed in claim 4, wherein each encoder is an 8-bit/10-bit encoder.

9. A decoder network, comprising:
    a plurality of pairs of decoders, each decoder capable of decoding an input byte of binary data based on a control input signal to provide a corresponding output byte of binary data and a control output signal;
    a first control signal source providing a first control input signal to one decoder of each of said pairs of decoders;
    a second control signal source providing a second control input signal to the other decoder of each of said pairs of decoders;
    a data source providing successive input bytes of binary data cyclically to each decoder pair, for simultaneous decoding thereof by each decoder of such decoder pair;
    a like plurality of multiplexers, each multiplexer multiplexing the output bytes and control output signals provided by the two decoders of an associated one of said plurality of pairs of decoders in accordance with a select control signal applied to a select input of such multiplexer each multiplexer applying its control output signal as the select control signal of another of said multiplexers to connect said plurality of multiplexers in a ring; and
    a delay circuit for delaying application of the control output signal of one of said multiplexers to the select input of the next multiplexer in the ring.

10. A decoder network as claimed in claim 9, wherein said delay circuit comprises a flip-flop.

11. A decoder network as claimed in claim 9, wherein each decoder is an 8-bit/10-bit decoder.

12. A decoder network, comprising:
    first, second and third decoders, each decoder capable of decoding an input byte of binary data based on a control input signal to provide a corresponding output byte of binary data and a control output signal;
    a first control signal source providing a first control input signal to said second decoder,
    a second control signal source providing a second control input signal to said third decoder;
    a data source providing successive bytes of binary data alternately to said first decoder, for decoding thereof by said first decoder, and in parallel to said second and third decoders, for simultaneous decoding thereof by said second and third decoders;
    an output connection;
    a selection circuit for selecting the binary data output bytes from one of said second and third decoders for application to said output connection, based on the control output signal from said first decoder; and
    a control circuit responsive to the control output signal from said first decoder for selecting one of the control output signal from said second decoder and the control output signal to said third decoder to provide a control input signal to said first decoder for use in decoding a subsequent byte of binary data.

13. A decoder network as claimed in claim 12, wherein said selection circuit comprises a multiplexer.

14. A decoder network as claimed in claim 12, wherein said control circuit comprises a multiplexer and a delay circuit.

15. A decoder network as claimed in claim 14, wherein said delay circuit comprises a flip-flop.

16. A decoder network as claimed in claim 12, wherein each decoder is an 8-bit/10-bit decoder.

17. A data communication system comprising:
   first, second, and third encoders, each encoder capable encoding an input byte of binary data based on a control input signal to provide a corresponding output byte of binary data and a control output signal;
   a first control signal source providing a first control input signal to said second encoder;
   a second control signal source providing a second control input signal to said third encoder;
   a data source providing successive bytes of binary data alternately to said first encoder, for encoding thereof by said first encoder, and in parallel to said second and third encoders, for simultaneous encoding thereof by said second and third encoders;
   a first selection circuit for selecting the output byte from one of said second and third encoders based on the control output signal from said first encoder;
   a first control circuit responsive to the control output signal from said first encoder for selecting one of the control output signal from said second encoder and the control output signal from said third encoder to provide a control input signal to said first encoder;
   first, second, and third decoders, each decoder capable of decoding an input byte of binary data based on a control input signal to provide a corresponding output byte of binary data and a control output signal;
   a third control signal source providing a third control input signal to said second decoder;
   a fourth control signal source providing a fourth control input signal to said third decoder;
   a transmission network coupling the output byte from said first encoder and the selected output byte from said second and third encoders to said first decoder and in parallel to said second and third decoders for decoding;
   a second selection circuit for selecting the output byte from one of said second and third decoders based on the control output signal from said first decoder;
   a second control circuit responsive to the control output signal from said first decoder for selecting one of the control output signal from said second decoder and the control output signal from said third decoder to provide a control input signal to said first decoder; and
   a decoder output circuit for outputting the output byte from said first decoder and the selected output byte from said second and third decoders.

18. A data communication system as claimed in claim 17, wherein each of said first and second selection circuits comprises a multiplexer.

19. A data communication system as claimed in claim 17, wherein each of said control circuits comprises a multiplexer and a delay circuit.

20. A data communication system as claimed in claim 19, wherein said delay circuit comprises a flip-flop.

21. A data communication system as claimed in claim 17, wherein each of said encoders is an 8-bit/10-bit encoder, and each of said decoders is an 8-bit/10-bit decoder.

22. A data communication system, comprising:
   a plurality of pairs of encoders, each encoder capable of encoding an input byte of binary data based on a control input signal to provide a corresponding output byte of binary data and a control output signal;
   a first control signal source providing a first control input signal to one encoder of each of said pairs of encoders;
   a second control signal source providing a second control input signal to the other encoder of each of said pairs of encoders;
   a data source providing successive input bytes of binary data cyclically to each encoder pair, for simultaneous encoding thereof by each encoder of such encoder pair;
   a like plurality of first multiplexers, each first multiplexer multiplexing the output bytes and control output signals provided by the two encoders of an associated one of said plurality of pairs of encoders in accordance with a select control signal applied to a select input of such multiplexer, each first multiplexer applying its control output signal as the select control signal of another of said first multiplexers to connect said plurality of first multiplexers in a ring,
   a first delay circuit for delaying application of the control output signal of one of said first multiplexers to the select input of the next first multiplexer in the ring;
   a plurality of pairs of decoders, each decoder capable of decoding an input byte of binary data based on a control input signal to provide a corresponding output byte of binary data and a control output signal;
   a third control signal source providing a third control input signal to one decoder of each of said pairs of decoders;
   a fourth control signal source providing a fourth control input signal to the other decoder of each of said pairs of decoders;
   a transmission line for applying the encoded data byte outputs of said plurality of first multiplexers as input bytes to said plurality of pairs of decoders;
   a like plurality of second multiplexers, each second multiplexer multiplexing the output bytes and control output signals provided by the two decoders of an associated one of said plurality of pairs of decoders in accordance with a select control signal applied to a select input of such multiplexer, each second multiplexer applying its control output signal as the select control signal of another of said second multiplexers to connect said plurality of second multiplexers in a ring;
   a second delay circuit for delaying application of the control output signal of one of said second multiplexers to the select input of the next one of said second multiplexers in the ring; and
   a decoder output circuit for outputting the decoded data byte outputs of said second plurality of multiplexers.

23. A data communication system as claimed in claim 22, wherein each of said encoders is an 8-bit/10-bit encoder, and each of said decoders is an 8-bit/10-bit decoder.

* * * * *